(12) United States Patent
Utsuno

(10) Patent No.: US 8,389,361 B2
(45) Date of Patent: *Mar. 5, 2013

(54) SEMICONDUCTOR DEVICE AND METHOD FOR FABRICATING THEREOF

(75) Inventor: Yukihiro Utsuno, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 13/069,269

(22) Filed: Mar. 22, 2011

(65) Prior Publication Data

US 2011/0171819 A1 Jul. 14, 2011

(30) Foreign Application Priority Data

Oct. 29, 2004 (WO) .................. PCT/JP2004/016119

(51) Int. Cl.
*H01L 21/336* (2006.01)

(52) U.S. Cl. ........................................ 438/260; 438/591

(58) Field of Classification Search .................. None
See application file for complete search history.

(56) References Cited

U.S. PATENT DOCUMENTS

| | | | |
|---|---|---|---|
| 5,379,253 A | 1/1995 | Bergemont | |
| 6,448,606 B1 | 9/2002 | Yu et al. | |
| 6,483,146 B2 | 11/2002 | Lee et al. | |
| 6,656,796 B2 | 12/2003 | Chan et al. | |
| 7,038,268 B2 | 5/2006 | Kinoshita et al. | |
| 7,115,458 B2 | 10/2006 | Rudeck | |
| 7,910,974 B2 * | 3/2011 | Utsuno | 257/315 |
| 2002/0126536 A1 | 9/2002 | Forbes et al. | |
| 2002/0190306 A1 | 12/2002 | Sasago et al. | |
| 2003/0022446 A1 | 1/2003 | Lee et al. | |
| 2004/0099900 A1 | 5/2004 | Iguchi et al. | |
| 2004/0108540 A1 | 6/2004 | Yoshino | |
| 2004/0150033 A1 | 8/2004 | Kinoshita | |
| 2005/0023599 A1 | 2/2005 | Song | |
| 2005/0056879 A1 | 3/2005 | Lee et al. | |
| 2005/0087795 A1 | 4/2005 | Sakuma et al. | |
| 2006/0038220 A1 | 2/2006 | Kusters et al. | |
| 2006/0043458 A1 * | 3/2006 | Rudeck | 257/315 |
| 2006/0060913 A1 | 3/2006 | Ozawa | |

FOREIGN PATENT DOCUMENTS

| | | |
|---|---|---|
| JP | 5090290 A | 4/1993 |
| JP | 06188426 | 7/1994 |
| JP | 11017038 A | 1/1999 |
| JP | 2004193226 A | 7/2004 |

OTHER PUBLICATIONS

Van Zant (Microchip Fabrication: A Practical Guide Semiconductor Processing, McGraw-Hill, New York, 2004, p. 414-415).

* cited by examiner

*Primary Examiner* — Benjamin Sandvik

(57) ABSTRACT

A silicon nitride film, which is a second hard mask, is dry etched to be removed completely. The silicon nitride film, which is formed on a sidewall of a silicon nitride film used as a first hard mask, has a relatively low etching rate. Therefore, if the silicon nitride film is continued etching until the corresponding portion thereof is removed, polysilicon is etched in a direction of depth in trench shape. Then, floating gates in adjacent cells are separated and a step portion of the polysilicon is formed. Consequently, a remaining portion of the silicon nitride film used as the first hard mask is removed, an ONO film is laminated on a whole surface of the poly silicon having the step portion on an edge that has been etched, and then, a polysilicon for a control gate is laminated on the ONO film.

8 Claims, 5 Drawing Sheets

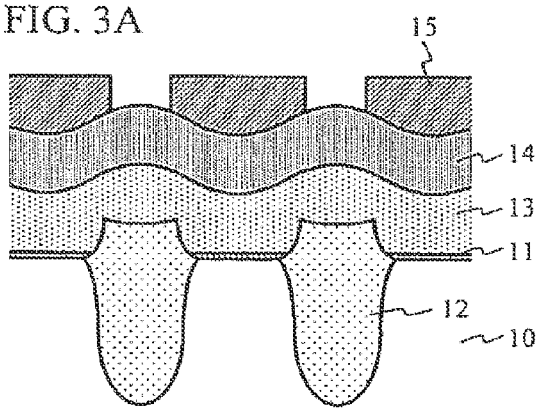
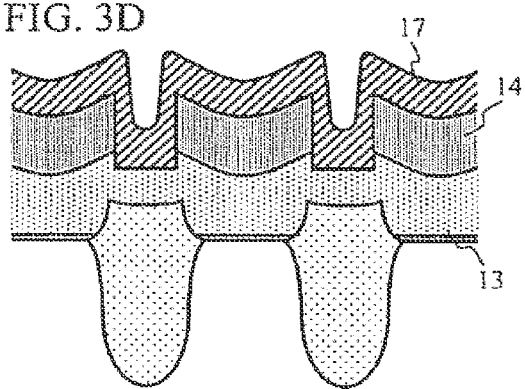
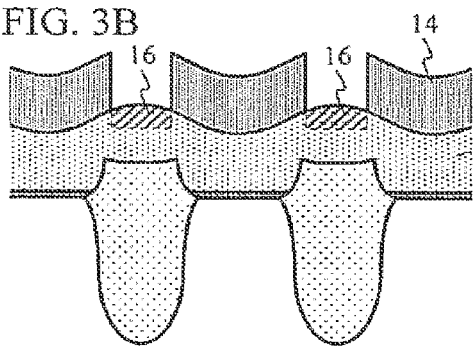
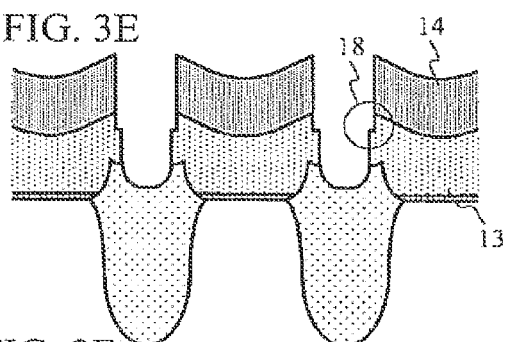
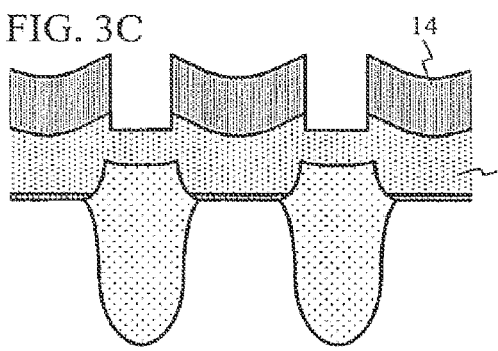
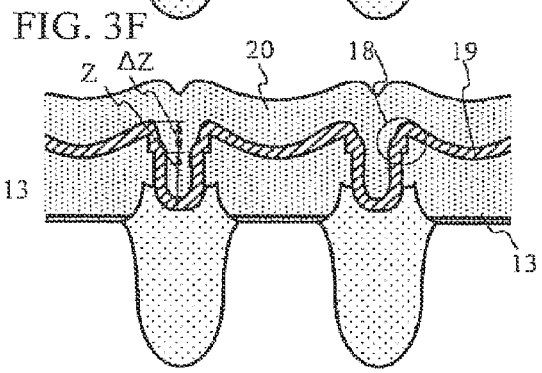
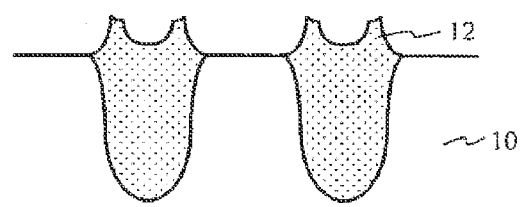

SEMICONDUCTOR DEVICE AND METHOD FOR FABRICATING THEREOF

CROSS-REFERENCE TO RELATED APPLICATIONS

This application is a divisional of U.S. patent application Ser. No. 11/261,176, filed on Oct. 28, 2005, entitled "Semiconductor Device and Method For Fabricating," which is a continuation of International Application No. PCT/JP2004/016119 filed Oct. 29, 2004 and which is hereby incorporated herein by reference in its entirety.

BACKGROUND OF THE INVENTION

1. Field of the Invention

This invention generally relates to semiconductors and methods for fabricating thereof, and more particularly, to a technique that has the ability of improving a product yield ratio without degrading operating characteristic of a flash memory cell.

2. Description of the Related Art

Flash memories are a type of electrically rewritable ROM, and are semiconductor devices widely used for mobile telephones, digital steel cameras, or communications networking devices.

Each of the flash memories includes a floating gate provided on a tunnel oxide film and a control gate applying bias to the floating gate. Information is written and erased by injecting or extracting an electron into or from the floating gate via the tunnel oxide film according to the bias applied to the floating gate. Here, a dielectric film is formed on an outer circumference of the floating gate of each cell, serving as a quantum-mechanical energy barrier, so that the injected electron may not be leaked out of the floating gate.

However, as the dielectric film is thinner, there is a higher possibility that the electron that has obtained energy leaps over the energy barrier to the outside of the floating gate. This is the reason the dielectric film is generally composed of an ONO film (a three-layer laminated film of oxide film/nitride film/oxide film) or an ON film (a two-layer laminated film of oxide film/nitride film), both of which have a high dielectric constant (as disclosed in Japanese Patent Application Publication No. 2004-193226).

FIGS. 1A through 1D are schematic sectional views of a single memory illustrating a conventional manufacturing process of the flash memory. FIGS. 2A and 2B are schematic plan views of a part of the flash memory in the manufacturing process to describe the schematic sectional views of FIGS. 1A through 1D. FIGS. 1A through 1D are the schematic views taken along a line A-A shown in FIGS. 2A and 2B.

In the above-mentioned figures, a reference numeral 100 represents a semiconductor substrate of silicon or the like, a reference numeral 101 represents a tunnel oxide film, a reference numeral 102 represents a shallow trench isolation (STI), a reference numeral 103 represents polysilicon to be formed into the floating gate, a reference numeral 104 represents a photoresist to serve as a mask for etching, a reference numeral 105 represents an ONO film, and a reference numeral 106 represents an etching residue of the ONO film as will be described later. In addition, a reference numeral 107 is a mask for forming a control gate (control gate mask), a reference numeral 108 represents a floating gate, a reference numeral 109 represents a control gate, and a reference numeral 110 is an active region.

As shown in FIG. 2A, the STI (102) is provided to extend in stripes in parallel with an extending direction of the control gate mask 107, and the polysilicon 103, which will be formed into the floating gate, extends in the same direction as the STI does in stripes in a region sandwiched by two stripes of the STI. Referring to FIGS. 1A through 1D, the thin tunnel oxide film 101 having thickness of 75 to 150 Å is formed on the semiconductor substrate 100. An activating region in each cell is isolated by the STI (102) formed in the semiconductor device 100. The tunnel oxide film 101 and the STI (102) are covered with the polysilicon 103 to be formed into the floating gate, and the photoresist 104, which will serve as a mask to etch a part of the polysilicon 103, is laminated thereon (FIG. 1A). Here, the polysilicon has the thickness of, for example, 300 to 1200 Å. The polysilicon 103 is etched to separate the floating gates 108 in adjacent cells.

After etching is performed with the photoresist 104 serving as a mask, a top surface of the polysilicon 103 provided on the STI (102) is partially etched, and a top surface of the STI (102) is partially exposed. Then, the floating gates 108 in the adjacent cells are separated (FIG. 1B). After the photoresist 104 is removed because the mask is not necessary any longer, the ONO film 105 is laminated on the whole surface of the substrate (FIG. 1C). The ONO film 105 is controlled to have the thickness of 100 to 250 Å in converting the electric characteristic into the oxide film.

Consequently, the polysilicon 103 and the ONO film 105 are removed by dry etching, the polysilicon 103 and the ONO film 105 being provided in regions other than the region to be formed into the control gate (a peripheral region of the cell). However, the ONO film 105 provided on the sidewall of the polysilicon 103 cannot be removed completely, because the ONO film, which has been formed on the sidewall of the polysilicon 103, is relatively thick and has height of 400 to 500 Å (shown as Z' in FIG. 1C). As a result, a residue of the ONO film 105 is remained (FIG. 1D) on lines shown as dotted lines (FIG. 2B).

As described above, according to the conventional techniques, dry etching for the purpose of separating the control gate cannot remove the whole dielectric film (the ONO film or ON film) formed on the sidewall of the floating gate, resulting in that the dielectric film partially remains as a residue.

The residue of the dielectric film is lifted off in an etching bath in a hydrofluoric acid etching process in a later process, floats as particles in an etchant, and adheres again, lowering the yield of the semiconductor device.

The floating gate, partially remaining on the sidewall of the dielectric film as an etching residue, also causes short-circuiting between the floating gates in the cells adjacent to each other in a direction of the bit line.

In order to solve the above-mentioned problems, the residue of the dielectric film can be reduced by controlling the etching period of the dielectric film that is necessary together with etching in a control gate forming process. However, the etching selectivity of the material of the floating gate to that of the dielectric film is not sufficiently high. This will develop etching of the material of the floating gate too much and lead to over-etching, the over-etching damages the tunnel oxide film, and the device characteristic will be degraded as a result.

The dielectric film formed on the sidewall of the floating gate can be removed by the CMP process. Nevertheless, this method will degrade the degree of the gate coupling, and the device characteristic will be degraded as a result.

SUMMARY OF THE INVENTION

The present invention has been made in view of the above-mentioned problems and has the object of providing a technique that has the ability of improving the product yield ratio without degrading operating characteristic of the semiconductor device.

According to an aspect of the present invention, preferably, there is provided a semiconductor device including a semiconductor substrate, and a cell region having a tunnel oxide film, a floating gate, a dielectric film and a control gate that are laminated in that order on the semiconductor substrate, the floating gate including a sidewall having a step on which the dielectric film is provided. On the above-mentioned semiconductor device, the sidewall of the floating gates may have a plurality of steps on which the dielectric film is provided. On the above-mentioned semiconductor device, the steps may be provided at intervals approximately equal to h/(n+1) where n is the number of steps and h is the height of the sidewall of the floating gate. Preferably, the above-mentioned floating gate may include one of polysilicon and amorphous silicon. Preferably, the above-mentioned floating gate may be doped with phosphorus. On the above-mentioned semiconductor device, the dielectric film may include one of an ON film having a silicon oxide film and a silicon nitride film laminated in this order and an ONO film having a silicon oxide film, a silicon nitride film and another silicon oxide film laminated in this order.

According to another aspect of the present invention, preferably, there is provided a method of fabricating a semiconductor device including providing a tunnel oxide film on a semiconductor substrate, forming a first mask having a first window having a size W1 on a conductive film provided on the tunnel oxide film, a floating gate of the semiconductor device being defined from the conductive film, etching a part of the conductive film in a thickness direction thereof from the first window of the first mask, removing the first mask, forming a second mask having a second window that has a size W2 (<W1) on the conductive film and is concentric with the first window, and etching a rest of the conductive film in the thickness direction by using the second mask to thereby form a step on a sidewall of the conductive film.

On the above-mentioned method, the first and second masks may be hard masks of a silicon nitride film or a silicon oxide film. On the above-mentioned method, the first and second masks may be photoresist masks. The above-mentioned method may further include thermally oxidizing the conductive film to round a corner of the step formed on the sidewall of the conductive film.

According to the present invention, a step portion on a sidewall of polysilicon to be formed into the floating gate by using a hard mask or photoresist mask. The aforementioned step portion is capable of configuring a height from the step portion to a top surface of the STI to be lower than the conventional configuration, the STI being used for element isolation. The generation of a residue can be suppressed after a dielectric film is etched, without degrading the operational characteristic of device elements.

In addition, by providing the step portion in the floating gate, it is possible to reduce the coupling noise in adjacent bits and suppress the generation of an error at the time of reading (data read error).

That is, the present invention is capable of providing the technique that can enhance the product yield without degrading the operational characteristic of the semiconductor memory device.

BRIEF DESCRIPTION OF THE DRAWINGS

FIGS. 3A through 3G are views illustrating a first example of a method for fabricating the semiconductor device of the present invention;

DESCRIPTION OF THE PREFERRED EMBODIMENTS

Figure 1A:
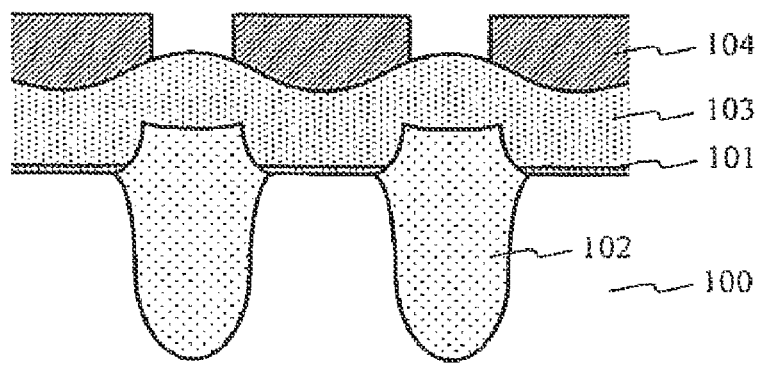
FIGS. 1A through 1D are schematic sectional views of a single memory illustrating a conventional manufacturing process of the flash memory.
Figure 1B:
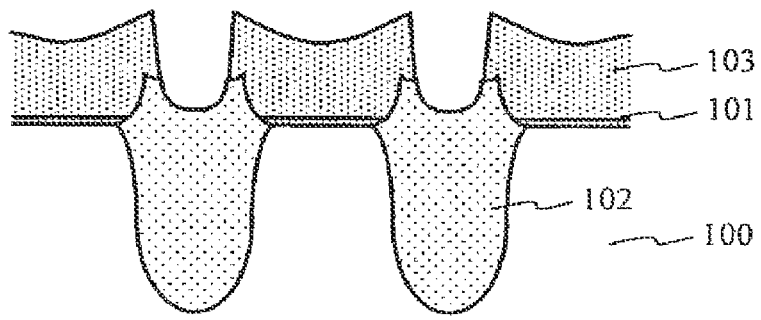
Figure 1C:
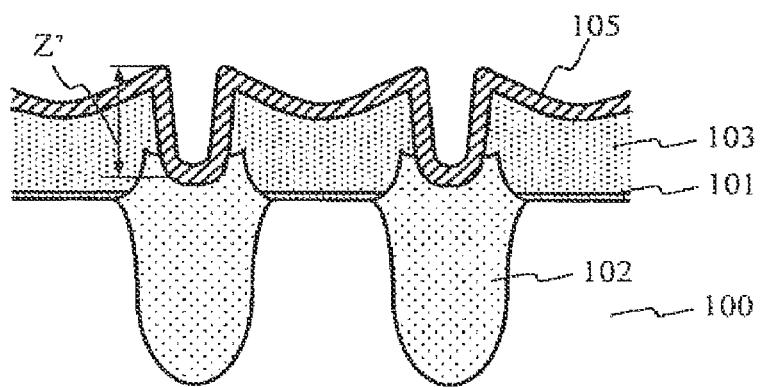
Figure 1D:
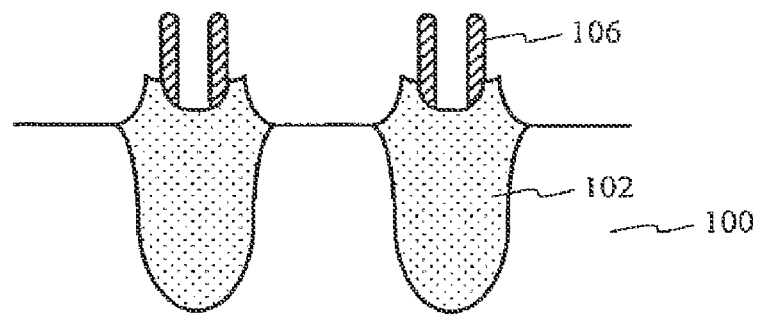
Figure 2A:
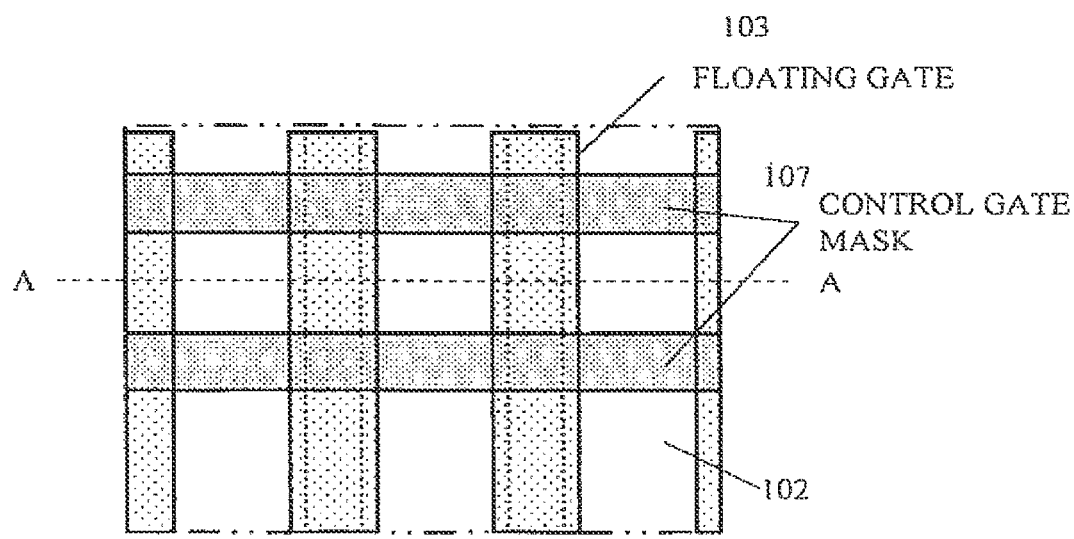
FIGS. 2A and 2B are schematic plan views of a part of the flash memory in the manufacturing process to describe the schematic sectional views of FIGS. 1A through 1D.
Figure 2B:
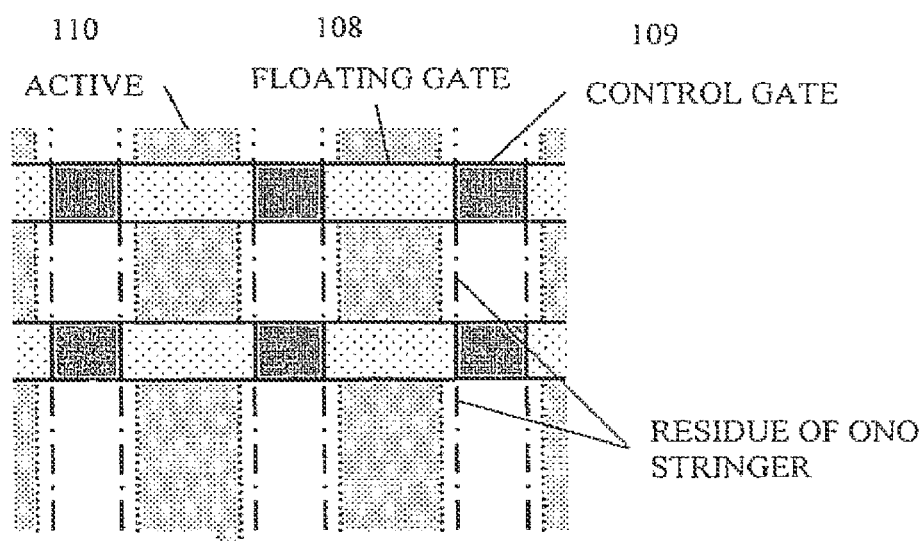

A description will now be given, with reference to the accompanying drawings, of embodiments of the present invention.

In the present invention, a step portion is formed on the sidewall made of polysilicon, which will be formed into the floating gate, with the use of a hard mask or photoresist mask so as not to degrade the operating characteristic and not to produce the residue of the dielectric film in the wet etching process. The step portion thus provided is capable of reducing the height from the step portion to the top surface of the STI used for element isolation (which is equal to the height of an edge of the dielectric film) as compared to the conventional structure. If the height of the edge of the dielectric film, formed on the sidewall of the floating gate, is to be reduced, the residue can be suppressed after the dielectric film is etched.

The step portion provided in the floating gate is capable of reducing the coupling noise in the adjacent bits, and is also capable of suppressing the error at the time of reading (data read error).

Further, thermal oxidization is performed to round a corner of the floating gate formed by the step portion provided on the sidewall of polysilicon. "Rounding" the corner of the floating gate is capable of preventing an electric field from concentrating on the aforementioned corner, and at the same time, is capable of lowering the floating gate edge (sidewall).

A description will now be given of embodiments of the present invention.

First Embodiment

FIGS. 3A through 3G are views illustrating a first example of a method for fabricating the semiconductor device of the present invention. In the figures, a reference numeral 10 represents the silicon substrate, a reference numeral 11 represents the tunnel oxide film, a reference numeral 12 represents the STI, a reference numeral 13 represents the phosphor doped polysilicon to be formed into the floating gate, a reference numeral 14 represents a first hard mask of a silicon nitride film, a reference numeral 15 represents a photoresist, a reference numeral 16 represents one region of the polysilicon 13 to be removed in the etching process described later, a reference numeral 17 represents a second hard mask of the silicon nitride film, a reference numeral 18 represents a step portion on the polysilicon 13, a reference numeral 19 represents an ONO film of a high dielectric film, and a reference numeral 20 represents polysilicon to be formed into the control gate.

A description will be given of the method for fabricating the semiconductor device more detail, with reference to the drawings.

First, there is formed the tunnel oxide film 11, which is thin and has the thickness of, for example, 75 to 150 Å on a main surface of the semiconductor substrate 10. The activating regions in the respective cells are isolated by The STI (12) formed in a region close to the surface in the semiconductor substrate 10. Then, the tunnel oxide film 11 and the STI (12) are covered with the polysilicon 13 to be formed into the floating gate. The silicon nitride film 14 and the photoresist 15 are formed thereon, the silicon nitride film 14 serving as the first hard mask, the photoresist 15 having been patterned as a mask so as to partially etch the silicon nitride film (FIG. 3A).

The polysilicon 13 to be formed into the floating gate may have the thickness of, for example, 300 to 1200 Å, and the silicon nitride film 14, which is the first hard mask, may have the thickness of, for example, 300 to 800 Å.

By using the photoresist 15 as a mask, a given region of the silicon nitride film 14 is dry etched from the opening thereof so as to form the first hard mask used for etching a region 16, shown as hatching, in the polysilicon 13 in the next process. Here, after the given region of the silicon nitride film 14 is etched, the photoresist 15, which has been used as an etching mask, is removed (FIG. 3B).

As shown in FIG. 3B, the polysilicon 13 is partially etched with the silicon nitride film 14 having openings, as shown in FIG. 3, which serves as a mask (FIG. 3C). The etching depth ranges, for example, from 100 to 1000 Å. Here, the polysilicon 13 is partially etched instead of removing the whole polysilicon 13 (the regions corresponding to the openings of the silicon nitride film 14). This is because the edge that has been etched on the polysilicon 13 is made to have a step shape in a later process of etching that employs the silicon nitride film 17 as the second hard mask.

Consequently, the silicon nitride film 17 of the second hard mask is formed on the whole surface to have the thickness of 300 to 1000 Å (FIG. 3D). The silicon nitride film 17 is dry etched to be removed completely. The silicon nitride film 17, which is formed on the sidewall of the silicon nitride film 14 that has been used as the first hard mask, has a relatively low etching rate. The silicon nitride film 17 acts as if the sidewall of silicon nitride were being formed. If the silicon nitride film 17 is continued etching until the corresponding regions in the polysilicon nitride film 17 are removed, the polysilicon 13 is etched in a direction of depth in shape of trench and the adjacent floating gates are isolated. The step portion 18 of polysilicon is formed as shown in FIG. 3E.

After the step portion 18 is formed in this manner, a remaining portion of the silicon nitride film used as the first hard mask is removed, and then the ONO film 19 is laminated on the whole surface of the polysilicon 13 having the step portion 18 on the edge thereof that has been etched. Then, the polysilicon 20 is laminated on the ONO film 19 to be formed into the control gate (FIG. 3F). The ONO film 19 is controlled to have the thickness of 100 to 250 Å in terms of the oxide film converted from the electric characteristic thereof.

As shown in the above-mentioned figures, the step portion 18 is provided on the edge of the polysilicon 13. Therefore, a height (Z) from the step portion 18 to the top surface of the STI (12) becomes lower than that of the conventional structure by $\Delta Z$. The height Z from the step portion 18 to the top surface of the STI (12) and $\Delta Z$ may be varied as necessary. However, for example, Z may range from 200 to 700 Å, and $\Delta Z$ may range from 200 to 800 Å. In addition, a width of terrace in the step portion 18 is configured to be approximately 300 Å.

The films formed in a peripheral region of the cell (such as the polysilicon 13 to be formed into the floating gate, the ONO film 19, and the polysilicon 20 to be formed into the control gate) are removed by etching. In this etching process, however, etching is developed in the same manner as the ONO film 19 is separately formed in two regions of an upper side of the step portion 18 in the polysilicon 13 (the ONO film having the height of $\Delta Z$) and a lower one thereof (the ONO film having the height of Z). For this reason, the respective ONO films are etched extremely rapidly, and this does not produce the residue of the ONO film 19 after etching (FIG. 3G).

In FIGS. 3A through 3G, an example is shown that only one step portion 18 is formed on the sidewall of the polysilicon 13, yet multiple step portions 18 may be provided. In this case, necessary number of the hard masks is added according to the number of the step portions to be provided, for example, a third hard mask is added for providing two step portions and a fourth hard mask is added for providing three step portions.

Where on the sidewall of the polysilicon 13 (the height) the step portion 18 is arranged may be varied as necessary. However, assuming that the number of the step portions 18 is set to n, the height of the sidewall of the polysilicon 13 is set to h, and the steps portion 18 are provided at intervals approximately equal to h/(n+1), the heights of the respective ONO films separated by the respective step portions 18 are approximately equal. This is desirable because the periods for etching the ONO films 19 are almost equal.

The step provided in the floating gate is also effective for reducing the coupling noise of adjacent bits. As the miniaturization of the device is progressed, the coupling noise between the adjacent bits (capacity of the adjacent bits) presents a problem. For example, if there are a bit in write state (the state having an electron in the floating gate) and another bit in erase state adjacently arranged to each other, the threshold voltage of the bit in erase state may be recognized as high and read as the write state. However, if there is the step portion in the floating gate in accordance with the present invention, the areas of the sidewalls in the adjacent floating gates can be reduced, resulting in that the capacity can be reduced between the floating gates in the adjacent bits. Hence, the coupling noise between the adjacent bits can be lowered, and this makes it possible to suppress an error at the time of reading (data read error).

Second Embodiment

In the first embodiment of the present invention, the hard mask made of silicon nitride film is employed for forming the step portion 18 on the sidewall of the polysilicon 13. This step portion may be formed with a general photolithography technique with the use of a photoresist mask.

Figure 4A:
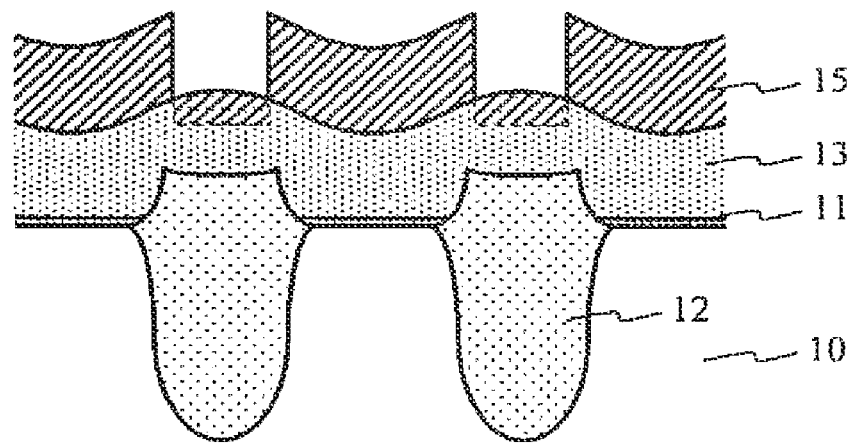
FIGS. 4A through 4C are views illustrating a second example of the method for fabricating the semiconductor device of the present invention.
Figure 4B:
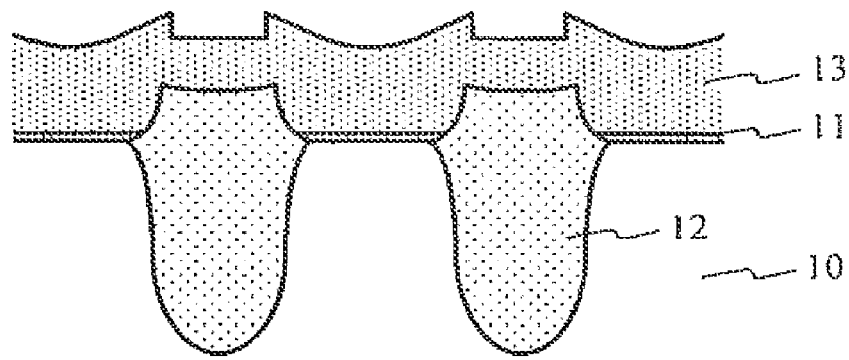
Figure 4C:
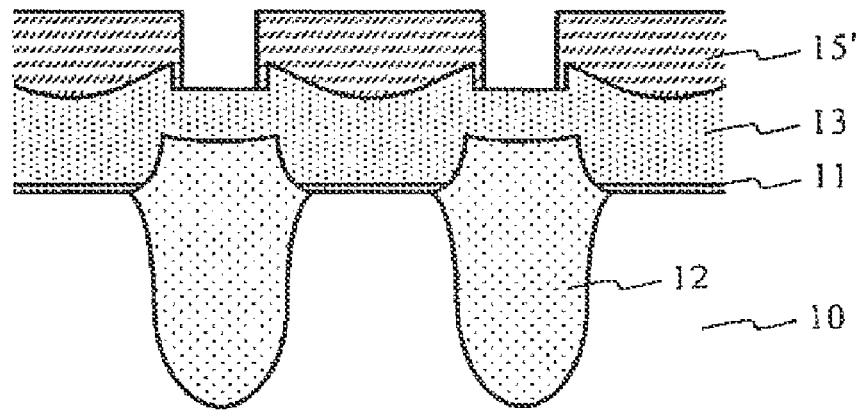

FIGS. 4A through 4C are views illustrating a second example of the method for fabricating the semiconductor device of the present invention. In FIGS. 4A through 4C, the same components and configurations as those of the first embodiment have the same reference numerals.

First, there is formed the tunnel oxide film 11, which is thin and has the thickness of, for example, 75 to 150 Å on a main surface of the semiconductor substrate 10. The activating regions in the respective cells are isolated by The STI (12) formed in a region close to the surface in the semiconductor substrate 10. Then, the tunnel oxide film 11 and the STI (12) are covered with the polysilicon 13 to be formed into the floating gate. The photoresist 15 having been patterned as a mask is laminated so as to partially etch the silicon nitride film (FIG. 4A). The polysilicon 13 to be formed into the floating gate may have the thickness of, for example, 300 to 1200 Å.

By using the photoresist 15 as a mask, a given region of the polysilicon 13 is etched from the opening thereof. After the given region in the polysilicon 13 is etched, the photoresist 15, which has been used as an etching mask, is removed (FIG. 4B).

Consequently, another photoresist 15' having a space narrower than the mask used in FIG. 4A is laminated, and the polysilicon 13 is etched to form the step portion with the opening of the mask (FIG. 4C).

Later processes are same as described in FIGS. 3E through 3G, and a description is omitted here.

Even in forming the step portion on the sidewall of the polysilicon 13 with the use of the general photolithography technique with the photoresist mask, etching is performed in the same manner as the ONO film 19 is separately formed in two regions having the upper side of the step portion 18 in the polysilicon 13 (the ONO film having the height of $\Delta Z$) and the lower one thereof (the ONO film having the height of Z). For this reason, the respective ONO films are etched extremely rapidly, and this does not produce the residue of the ONO film 19 after etching (FIG. 3G).

Here, in FIGS. 4A through 4C, the example of forming one step portion is shown with the use of two photoresist masks. However, as in the first embodiment, multiple steps may be provided. In this case, the number of the photoresist masks is added according to the number of the step portions.

Third Embodiment

In either the first or second embodiment, another process is not performed in order to apply a special change to the shape of the step after the step portion 18 is formed on the sidewall of the polysilicon 13. However, the step portion 18 of the polysilicon 13 has a sharp angle (corner) in a cross-sectional outline thereof. If this is used as the floating gate in a cell region, the electric filed concentrates on the corner, causing dielectric breakdown in the ONO film 19. In order to avoid the aforementioned dielectric breakdown, it is preferable that the corner of the step portion 18 should be rounded by thermal oxidization after the step portion 18 is formed.

Figure 5A:
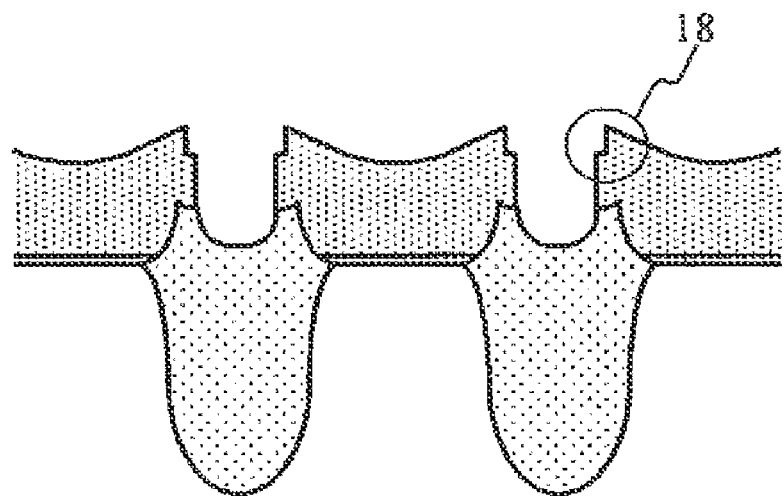
FIGS. 5A through 5C are views illustrating a third example of the method for fabricating the semiconductor device of the present invention.
Figure 5B:
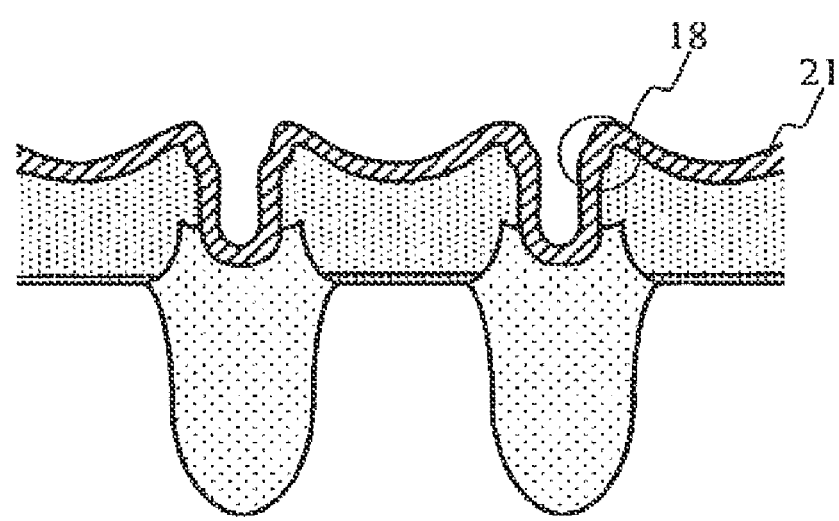
Figure 5C:
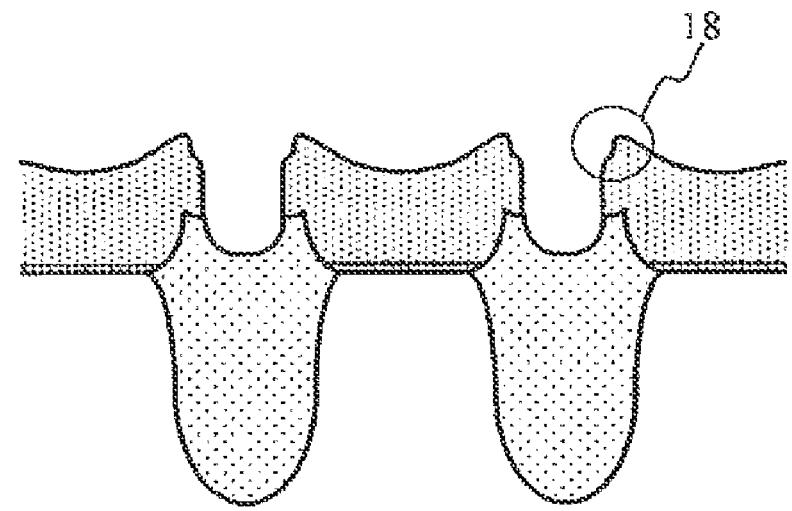

FIG. 5A through 5C are views illustrating a process for rounding the corner of the step portion 18 by the thermal oxidization. FIG. 5A shows a state in which the silicon nitride film 14 of the first hard mask is removed after the process shown in FIG. 3E is finished. As shown in this figure, after the silicon nitride film 14 is removed, there is provided a sharp corner on an edge in a region having a terrace and a top in the step portion 18 on the sidewall of the polysilicon 13.

The polysilicon 13 having the aforementioned state is thermally oxidized to form an oxidized film 21 (FIG. 5B). In this oxidization process, silicon atoms in a surface region of the polysilicon 13 are reacted with oxygen to be formed into the oxidized film and the above-mentioned corners have rounded shapes. After the "rounding" is performed, thus formed oxidized film 21 is wet etched with an etchant such as ammonia and hydrogen peroxide solution or dry etched with RIE, ensuring the polysilicon that does not have the corner in the step portion 18 (FIG. 5C). Even used for the floating gate in the cell region, the polysilicon 13 has the shape that does not cause the dielectric breakdown in the ONO film 19. Later processes are same as described in FIG. 3F and later, and a description is omitted here.

Additionally, the description has been given of the dielectric film as the ONO film having a high dielectric constant. However, the dielectric film is not limited to the ONO film, and other films such as the ON film are applicable. Further, the floating gate is not necessarily formed of polysilicon, and may be formed of amorphous silicon. Moreover, a silicon oxidized film may be employed instead of the silicon nitride film.

As described above, according to the present invention, it is possible to provide a technique that has the ability of improving the product yield ratio without degrading operating characteristic of the semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a semiconductor device, comprising:
   providing a tunnel oxide film on a semiconductor substrate;
   forming a first mask having a first window having a size W1 on a conductive film provided on the tunnel oxide film, a floating gate of the semiconductor device being defined from the conductive film;
   etching a part of the conductive film in a thickness direction thereof from the first window of the first mask;
   removing the first mask;
   forming a second mask having a second window that has a size W2 (<W1) on the conductive film that is concentric with the first window; and
   etching a rest of the conductive film in the thickness direction by using the second mask to form a step on a sidewall of the conductive film,
   wherein the first and second masks are photoresist masks.

2. The method as claimed in claim 1, wherein the first and second masks are hard masks of a silicon nitride film or a silicon oxide film.

3. The method as claimed in claim 1, further comprising thermally oxidizing the conductive film to round a corner of the step formed on the sidewall of the conductive film.

4. A method of fabricating a semiconductor device comprising:
   forming a semiconductor substrate; and
   forming a cell region having a tunnel oxide film, a floating gate, a dielectric film and a control gate that are laminated in this order on the semiconductor substrate, wherein the floating gate is formed to include a plurality of steps that are formed successively inward in the direction from the bottom of the floating gate to the top thereof wherein the steps are provided at intervals approximately equal to h/(n+1) where n is the number of steps, h is the height of the sidewall of the floating gate and the steps are of equal length.

5. The method as claimed in claim 4, wherein the floating gate comprises one of polysilicon and amorphous silicon.

6. The method as claimed in claim 4, wherein the floating gate is doped with phosphorus.

7. The method as claimed in claim 4, wherein the dielectric film comprises one of an ON film having a silicon oxide film and a silicon nitride film laminated in this order and an ONO film having a silicon oxide film, a silicon nitride film and another silicon oxide film laminated in this order.

8. The method as claimed in claim 4, wherein the gate includes a sidewall having a step formed from a single material on which the dielectric film is provided.

* * * * *